United States Patent [19]
Nawata et al.

[11] Patent Number: 4,835,588
[45] Date of Patent: May 30, 1989

[54] TRANSISTOR

[75] Inventors: Yoshiaki Nawata, Yokohama; Kunihisa Ono, Hatano; Koji Takahashi, Kamakura; Yoshiyasu Kanno, Kawasaki, all of Japan

[73] Assignee: Fujitsu Limited, Kawasaki, Japan

[21] Appl. No.: 173,131

[22] PCT Filed: Mar. 9, 1979

[86] PCT No.: PCT/JP79/00059

§ 371 Date: Nov. 2, 1979

§ 102(e) Date: Nov. 2, 1979

[87] PCT Pub. No.: WO79/00736

PCT Pub. Date: Oct. 4, 1979

[30] Foreign Application Priority Data

Mar. 10, 1978 [JP] Japan ................. 53-27255

[51] Int. Cl.⁴ ............... H01L 29/72; H01L 29/08
[52] U.S. Cl. ........................ 357/36; 357/51; 357/86
[58] Field of Search ............ 357/36, 34, 28, 51, 357/20, 86

[56] References Cited

U.S. PATENT DOCUMENTS

| 3,358,197 | 12/1967 | Scarlett | 357/36 |
| 3,427,511 | 2/1969 | Rosenzweig | 357/36 |
| 3,504,239 | 3/1970 | Johnson et al. | 357/36 |
| 3,519,898 | 7/1970 | Nakatani | 357/36 |
| 3,740,621 | 6/1973 | Carley | 357/36 |
| 4,151,542 | 4/1979 | Yajima et al. | 357/51 |
| 4,157,561 | 6/1979 | Nawata et al. | 357/36 |
| 4,266,236 | 5/1981 | Ueda | 357/51 |

FOREIGN PATENT DOCUMENTS

| 46-40454 | 11/1971 | Japan . | |
| 51-34209 | 8/1976 | Japan | 357/36 |
| 52-63073 | 5/1977 | Japan . | |
| 53-122168 | 8/1978 | Japan . | |
| 54-54272 | 4/1979 | Japan . | |
| 54-56571 | 4/1979 | Japan . | |

OTHER PUBLICATIONS

*RCA Power Transistors* (technical series PM 81, published by RCA, Somerville, J.J., 1971), pp. 23—33.

Primary Examiner—William D. Larkins
Attorney, Agent, or Firm—Staas & Halsey

[57] ABSTRACT

In a transistor wherein a plurality of emitter regions are formed in a base region, resistor regions which have the opposite conductivity type to the conductivity type of the emitter regions and which act as stabilizing resistors, are formed in the emitter regions. The resistors regions are commonly connected through an emitter wiring electrode or electrodes, and each of the resistor regions is connected to the emitter region corresponding thereto. In order to allow the conductor for connecting each of the resistor regions to the emitter region corresponding thereto to be arranged on a chip without intersecting the emitter wiring electrode or electrodes, the emitter regions are arranged in a line or lines, and the resistor regions are formed in the emitter regions so as to intersect the line or lines.

8 Claims, 9 Drawing Sheets

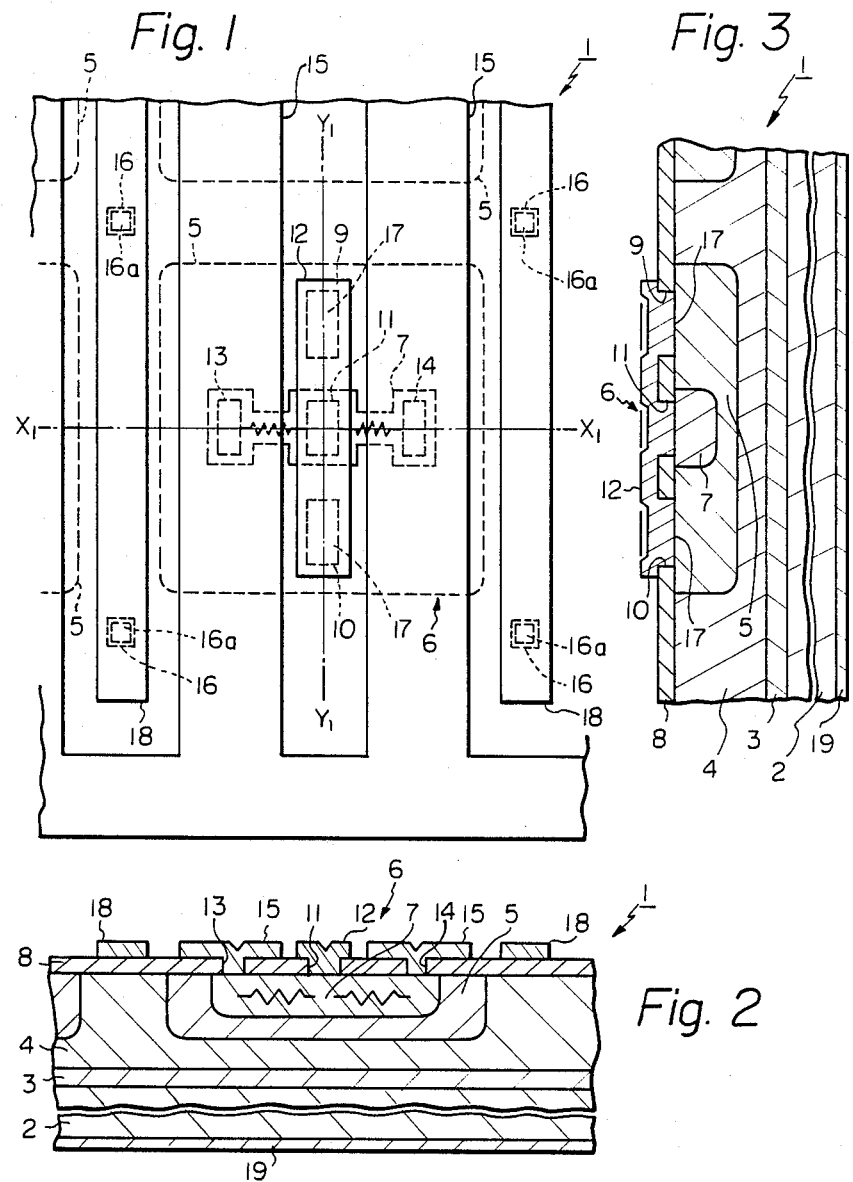

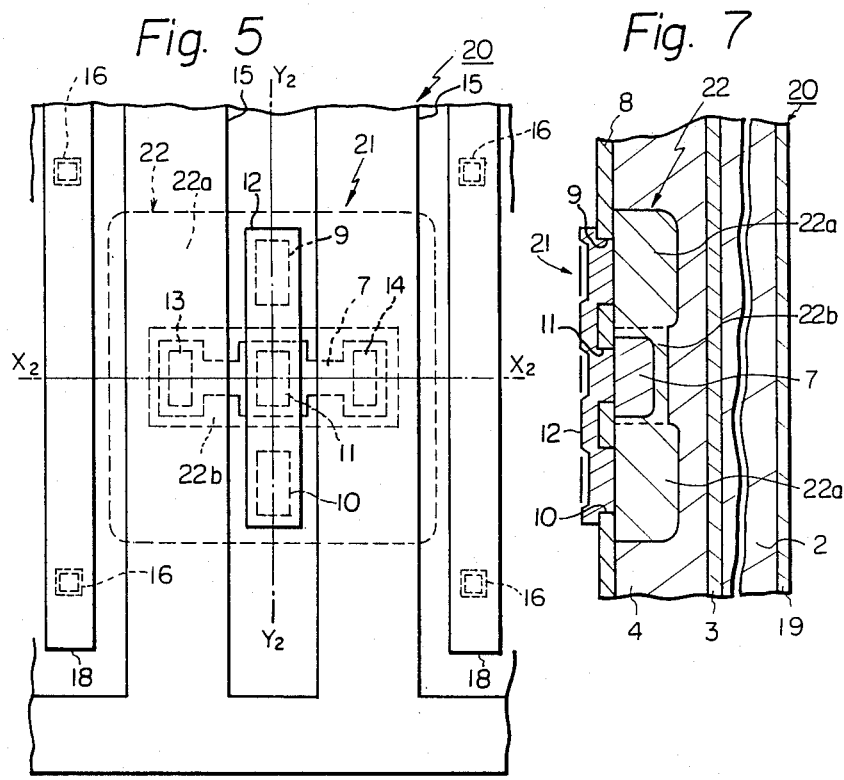
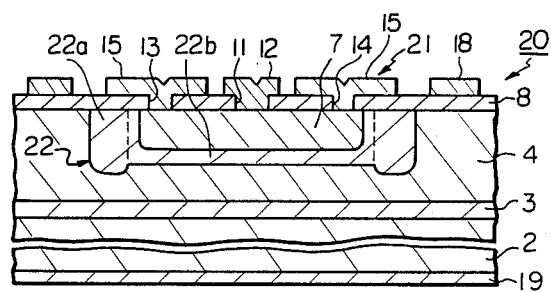

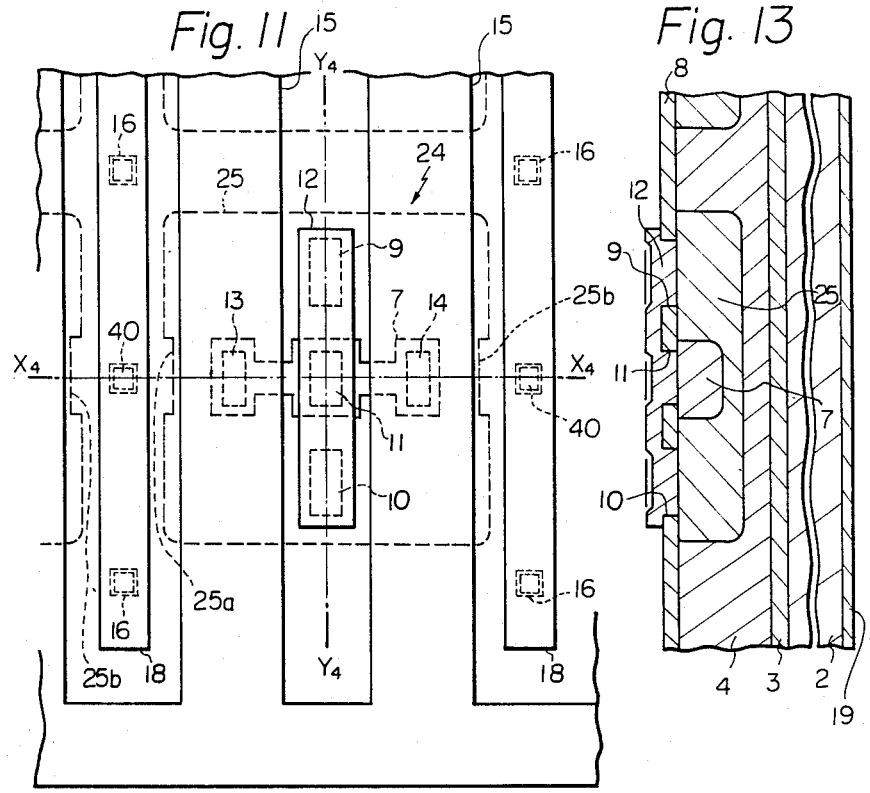
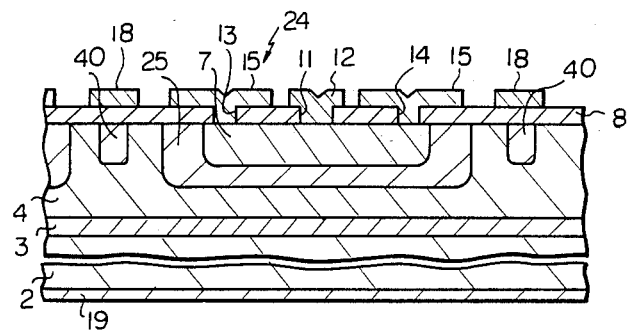

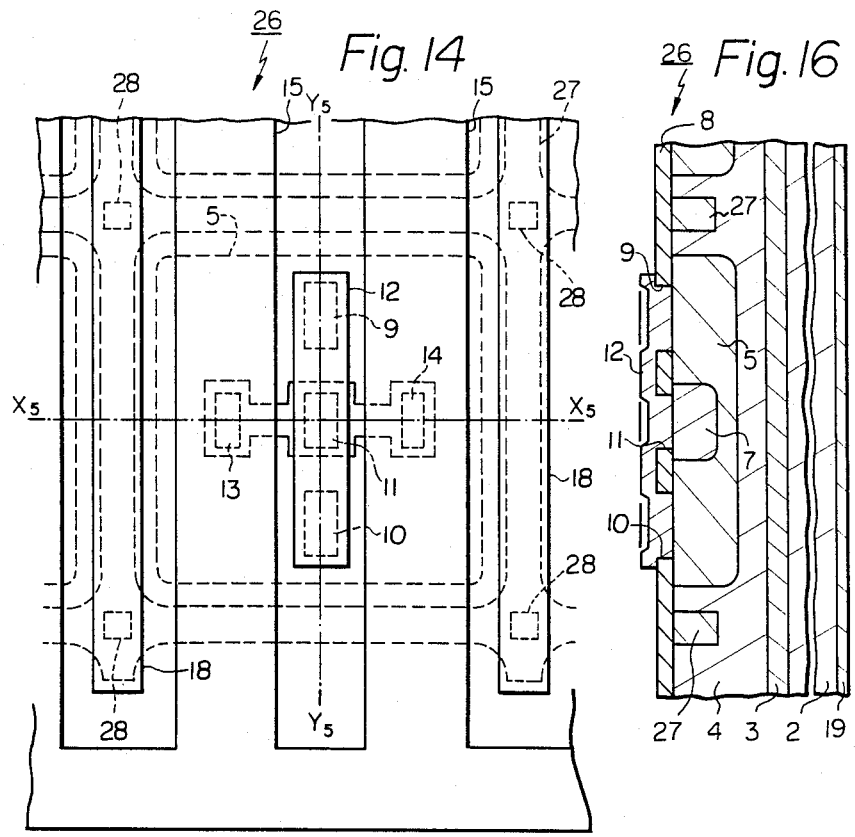
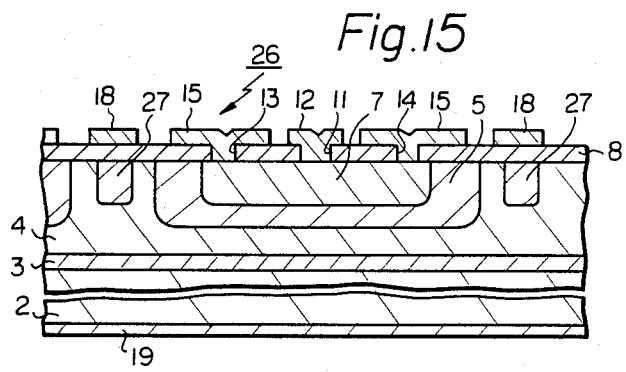

TRANSISTOR

BACKGROUND OF THE INVENTION

This invention relates to a transistor, and more particularly to a structure of a high output power transistor comprised of a plurality of transistor units formed on a single semiconductor substrate and connected in parallel with each other, each of the transistor units having a stabilizing resistor inserted in the emitter circuit thereof.

To improve characteristics in the high frequency range and yet obtain a higher output power, there have been developed and put into practical use, various transistors which comprise a plurality of transistor units formed on a single semiconductor substrate and connected in parallel to each other, such as overlay transistors, meshemitter transistors, ring-emitter transistors and emitter-ballast transistors. In the transistors of these types, however, all transistor units comprising a transistor do not always have equal electrical characteristics. It will, therefore, be appreciated that, when the transistor units connected in parallel to each other are placed in operation, some of the units may be subjected to overload, causing a secondary breakdown thereof. To prevent such secondary breakdown, stabilizing resistors are inserted in respective emitter circuits of the transistor units in the transistors of the aforementioned types, to effect negative feedback operation in the respective transistor unit circuit, so that the load applied to the transistor units will be uniform.

Various methods have been heretofore proposed for inserting the stabilizing resistor into the emitter circuit of the transistor unit. In a first method, a resistive material (e.g. a metal such as a Nichrome (Ni-Cr), polycrystalline semiconductor, etc.) is deposited in a desired thickness at an electrode window formed on an insulation layer covering the surface of the emitter region of the transistor unit. Then, an electrode is provided at one end of the deposited resistive material, so that a stabilizing resistor is inserted into the emitter circuit. In this case, if a desired resistance value cannot be attained by the stabilizing resistor formed by depositing the resistive material in the electrode window, the resistive material may be deposited so that it extends along the insulation layer.

Another method is such that, when emitter regions are formed in a base region, additional diffused regions, of the same conductivity type as that of the emitter regions, are formed simultaneously within the base region in a predetermined shape, and the diffused regions act as stabilizing resistor regions. These resistor regions may also be formed in a separate step from the step for forming the emitter regions. In case the stabilizing resistors are formed in accordance with this method, each of the diffused resistor regions may be so disposed that it may be in contact at one of its ends with a corresponding emitter region and connected at its other end to an electrode wire; or it may be isolated from the corresponding emitter region and connected at one of its ends to the emitter region through an electrode wire and at its other end to another electrode wire.

The above-mentioned previously proposed methods, however, involve such disadvantages as the number of steps for fabrication is increased, it is difficult to provide a device of excellent electrical properties and it is quite difficult to increase the integration density of transistor units. That is, in the former method, the number of fabrication steps is increased because steps are required for depositing and patterning the resistive material. In addition, where the number of the emitter regions is increased to obtain a higher output power, it becomes difficult to effect patterning because the area of each individual emitter region is reduced. Therefore, if the number of emitter regions is increased, it is difficult to increase the integration density and the chip size of the semiconductor device will be increased. Furthermore, the method in which a resistor is deposited using a suitable resistive material has not been reduced to practical use yet because it is difficult to find appropriate resistive materials which can satisfy both the resistance and the current capacity requirement.

On the other hand, in the latter method, in which the diffused resistor region formed in the base region and having the same conductivity type as that of the emitter region is used as a stabilizing resistor, the region insulated by a P-N junction from the base region is used, in effect, as the stabilizing resistor. It is, therefore, easy to provide the stabilizing resistor. However, since the conductivity type of the diffused resistor region acting as the stabilizing resistor is the same as that of the emitter region, carrier injection from the diffused resistor region to the base region occurs during the operation of the transistor. As a result, this method has a disadvantage that the current amplification factor is lowered.

SUMMARY OF INVENTION

An object of the present invention is to provide a transistor which is capable of utilizing a diffused resistor region having a conductivity type which is the same as that of an emitter region, without lowering the current amplification factor of the transistor.

Another object of the present invention is to provide a transistor which is capable of having connected therein a plurality of transistor units, each having a stabilizing resistor inserted in a respective emitter circuit, in parallel to each other, without intersection of wiring means on a chip.

A further object of the present invention is to provide a transistor which can be produced at high yield.

A still further object of the present invention is to provide a transistor which is capable of providing a high output power as well as improved electrical properties in the high frequency region.

According to the present invention, in a transistor comprising a collector region of one conductivity type, a base region of the opposite conductivity type formed in the collector region, and a plurality of emitter regions of the one conductivity type formed in the base region, all being provided on a semiconductor substrate, resistor regions of the opposite conductivity type operative as stabilizing resistors are formed in the respective emitter regions. The resistor regions are connected to the corresponding emitter regions through conducting means and commonly connected by an emitter wiring electrode or electrodes without contacting the conducting means. Consequently, each of the resistor regions is not directly in contact with the base portion, so that lowering of the current amplification factor of the transistor can be avoided.

Further, according to the present invention, in a transistor comprising a collector region of one conductivity type, a base region of the opposite conductivity type formed in the collector region, a plurality of emitter regions of the one conductivity type formed in the base region, all being formed on a semiconductor substrate, the emitter regions are arranged in a line or lines and each of the emitter regions has a resistor region of the opposite conductivity type acting as a stabilizing resistor which is disposed in such a manner that its longitudinal axis may cross the line or lines. The resistor regions are commonly connected by a linear emitter wiring electrode or electrodes. Moreover, resistor regions are connected to the emitter regions corresponding thereto, by conducting means which are disposed adjacently to the emitter wiring electrode or electrodes and are not in contact with the emitter wiring electrode or electrodes. In this case, the emitter wiring electrode or electrodes and the conducting means may be provided on an insulation layer covering a surface of the semiconductor substrate and necessary connection may be achieved by forming a window on the insulation layer. With this arrangement, there is no possibility that the wiring of the emitter wiring electrodes and the wiring of the conducting means can be crossed on the semiconductor substrate, and the chip size of the transistor can be reduced. Furthermore, the electrical characteristics of the transistor can be improved.

BRIEF DESCRIPTION OF DRAWING

FIG. 1 is a partly enlarged plan view of a transistor in accordance with the present invention;

FIG. 2 is a cross-sectional view taken along a line $X_1$—$X_1$ of FIG. 1;

FIG. 3 is a cross-sectional view taken along a line $Y_1$—$Y_1$ of FIG. 1;

FIG. 5 is a plan view of a unit transistor comprising another form of transistor embodying the present invention;

FIG. 6 is a cross-sectional view taken along a line $X_2$—$X_2$ of FIG. 5;

FIG. 7 is a cross-sectional view taken along a line $Y_2$—$Y_2$ of FIG. 5;

FIG. 11 is a plan view of a modified form of the transistor in accordance with the present invention as illustrated in FIG. 1;

FIG. 12 is a cross-sectional view taken along a line $X_4$—$X_4$ of FIG. 11;

FIG. 13 is a cross-sectional view taken along a line $Y_4$—$Y_4$ of FIG. 11;

FIG. 14 is a plan view of another modified form of the transistor in accordance with the present invention as illustrated in FIG. 1;

FIG. 15 is a cross-sectional view taken along a line $X_5$—$X_5$ of FIG. 14;

FIG. 16 is a cross-sectional view taken along a line $Y_5$—$Y_5$ of FIG. 14;

DESCRIPTION OF THE PREFERRED EMBODIMENTS

Figure 4:
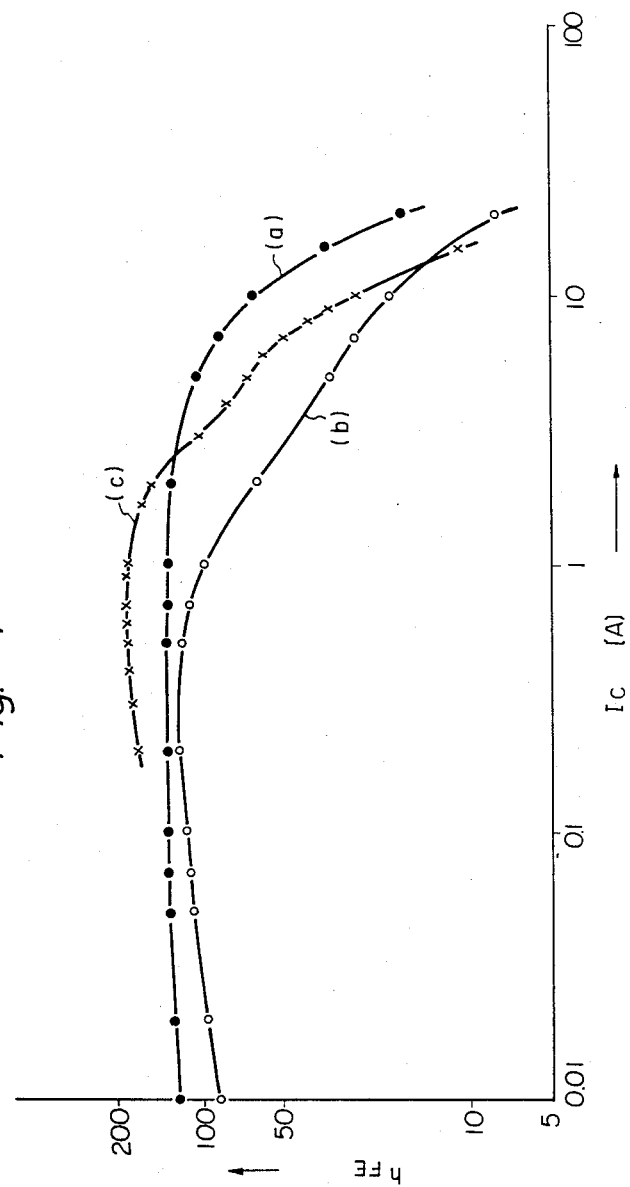
FIG. 4 is a characteristics diagram for illustrating the characteristics of the transistor in accordance with the present invention and the characteristics of known transistors.

Referring now to the accompanying drawings, there are illustrated preferred embodiments of the present invention.

FIG. 1 illustrates, in an enlarged scale, a part of a transistor in accordance with the present invention. The transistor 1 has, as illustrated in FIG. 2, a collector region 3 provided on an N-type semiconductor substrate 2 in the form of an N-type epitaxial layer, a P-type base region 4 formed contiguously to said collector region 3, and a number of $N^+$-type emitter regions 5 formed in said base region 4. Although only one emitter region 5 is illustrated in FIG. 2, a plurality of emitter regions 5 are arranged in a matrix structure within the base region 4 and each of the emitter regions 5 forms a transistor unit 6 in combination with the base region 4 and the collector region 3 as can be seen from FIG. 1. EAch emitter region 5 has a resistor region 7 acting as a stabilizing resistor and provided in the form of a $P^+$-type diffused region which is formed in the emitter region by effecting selective diffusion of suitable acceptor impurities. Thus, the resistor region 7 is isolated from the base region 4 by the emitter region 5, thereby effectively preventing unnecessary carrier injection from the resistor region 7 to the base region 4. Other transistor units are also provided with resistor regions, respectively, as in the transistor unit 6 illustrated. As a result, in each transistor unit, lowering of the current amplification factor which may possibly be caused by the provision of the stabilizing resistor can be prevented.

As depicted in FIG. 1, the resistor region 7 is formed in an elongated shape and is so disposed that a line extending along the length of the resistor region 7 may intersect a line defining the location of the emitter region. In this embodiment, the resistor region 7 is formed in such a way that the line extending along the length of the resistor region intersects a line defining the location of the emitter region at a right angle. A surface of the so constructed semiconductor substrate 2 is covered with an insulation layer 8 (FIG. 2) such as a silicon oxide layer. On the insulation layer 8 there are provided metal layers for wiring, as well as windows for connecting the metal layers to desired regions. More particularly, two windows 9 and 10 (FIG. 1) are formed on the insulation layer 8 at portions thereof confronting the emitter region 5, in such a manner that they are disposed along a line perpendicular to a line extending along the length of the resistor region 7; and a window 11 is formed on the insulation layer 8 at a portion thereof confronting the resistor region 7, so as to be aligned with windows 9 and 10. The emitter region 5 and the resistor region 7 are connected to each other through these windows 9, 10 and 11 by means of a metal layer 12 provided on the insulation layer 8 (see FIG. 3). A similar connection is provided in each of the other transistor units. Windows 13 and 14 are further provided at end portions of the resistor region 7. In other transistor units, windows corresponding to windows 13 and 14 are similarly provided on the insulation layer 8. Then, as can be understood from the foregoing description, the windows 13 and 14 of the respective transistor units are also arranged in a matrix formation. The resistor regions exposed through the respective windows 13 and 14 are connected by a plurality of common emitter wiring electrodes 15, each provided on the insulation layer 8 so as to be at right angles with a line extending along the length of the resistor region 7. That is, the emitter regions of the respective transistor units are commonly connected by the emitter wiring electrodes 15 through the resistor regions provided in the corresponding emitter regions, respectively. Thus, in a matrix arrangement of the plural emitter regions within the base region, a plurality of emitter regions are disposed in a line or lines and the resistor regions formed in the respective emitter regions are arranged in such a manner that lines extending along the lengths of the respective resistor regions may each cross lines defining the positions of the emitter regions. Therefore, it is possible that the metal layer 12 connecting a portion of each resistor region to the corresponding emitter region and the emitter wiring electrodes 15 commonly interconnecting the end portions of the respective resistor regions can be disposed on the insulation layer 8 without intersecting each other. Thus, as can be readily understood, the layout of the emitter regions is not limited to the matrix formation illustrated and it will suffice to arrange a plurality of emitter regions in a line or lines. In addition, although each resistor region has two portions connectable to the emitter wiring electrodes 15, respectively, in the embodiments disclosed herein, it may have only one portion for the purpose instead of two portions. However, it is to be noted that in case two emitter wiring electrodes 15 are provided per one transistor unit as in the present embodiment, the effective contact area of the wiring electrode is increased. Accordingly, where it is required to provide a high power transistor by connecting a plurality of transistor units in parallel to each other, it is particularly effective to juxtapose the emitter wiring electrodes.

Since the metal layer 12 and the wiring electrodes 15 are provided on the insulation layer 8 without intersecting each other, the provision of an insulation layer for insulating the metal layer 12 from the wiring electrodes 15 can be omitted. Therefore, the number of fabrication steps is reduced as compared with that of the conventional transistors. Furthermore, since the provision of the insulation layer for the wires is omitted, possible lowering in fabrication yield due to pin holes caused in the wiring insulation layer at the formation thereof can be prevented. The aforementioned advantages are one of the features of the transistor in accordance with the present invention. The construction of the transistor shown in FIGS. 1 to 3 has the feature that the major face of the respective emitter region 5 is formed generally in a rectangular shape and that base contact regions 16 are disposed on diagonal lines of the region 5. In the figures, the numeral 18 designates base wiring electrodes. The wiring electrodes 18 are connected to the respective base contact regions 16 by way of windows 16a formed on the insulation layer 8 facing the respective base contact regions 16. By arranging the base contact regions 16 as mentioned above, the base contact regions 16 may be located at positions relatively remote from the emitter contact region 17 corresponding thereto. The number 19 denotes a collector electrode. When the transistor unit is in operation, the greater part of the periphery of the emitter region 5 serves to flow a large current. Thus, if the arrangement wherein the base contact regions are disposed in the manner mentioned above and two emitter wiring electrodes are provided per one transistor unit, is used, a transistor suitably adapted for high power and yet having an excellent high frequency characteristic will be obtained. Each corner of the emitter region 5 is rounded into an arcuate shape having a suitable radius of curvature, to prevent current from concentrating at the corners.

The transistor comprised of the transistor unit as specified above may be prepared in the manner as mentioned hereinbelow.

The collector region 3 may be provided by forming an N-type semiconductor layer on an $N^+$-type semiconductor substrate in accordance with an epitaxial growth method; or by a method comprising, first, forming $N^+$-type semiconductor layers on the opposite sides of an N-type semiconductor substrate by diffusing donor impurities, at a high concentration, from the surfaces of the semiconductor substrate; and then, removing one of the $N^+$-type semiconductor layers formed on either side of the N-type semiconductor substrate.

The P-type base region may be provided by selectively or nonselectively diffusing acceptor impurities such as boron, etc., into the substrate. In this case, if the desired transistor is a transistor to be used in a high-voltage condition, it is preferred to employ a so-called mesa structure in which the base-collector junction appears on a side of the chip. On the other hand, if the desired transistor is a transistor to be used in a low-voltage condition, a planar structure is preferably employed.

The base contact region may be provided by a method wherein acceptor impurities are selectively diffused into the aforementioned P-type base region to form a region where the impurity concentration is higher than at the base region.

The $N^+$-type emitter regions may be provided by selectively diffusing donor impurities, e.g., arsenic (As), phosphorous (P), etc., at a high concentration into the base region.

The $P^+$-type resistor region may be provided by selectively diffusing acceptor impurities at a high concentration into the emitter regions. In this connection it is to be noted that, since it is not required that the value of the diffusion depth at the base contact regions be a precise predetermined value, the base contact regions may be formed simultaneously with the formation of the resistor regions where the value of the depth is to be regulated.

An example of a suitable insulation layer is a layer of silicon dioxide ($SiO_2$) formed by thermal oxidation or vapor growth. Silicon dioxide may be also employed in combination with silicon nitride ($Si_3N_4$), phospho-silicate glass (PSG), etc.

The emitter wiring electrodes, the base wiring electrode and the metal layers may be formed by evaporating aluminum, and then, effecting patterning so as to remove unnecessary portions. These wiring electrodes and metal layers are electrically connected to desired regions, respectively, through the windows formed in the insulation layer.

When the resistor region is formed in the emitter region according to the method mentioned above, if the depth of the emitter region is not sufficient, the depth of the emitter region will be increased to exceed the predetermined value due to the so-called "emitter dip effect". Consequently, the emitter-to-base breakdown voltage and the emitter-to-collector breakdown voltage may possibly be lowered and it might be difficult to obtain a large current amplification factor. The following are suggested to minimize the influence of the "emitter dip effect".

(1) The thickness of the base region is preliminarily increased selectively at a portion corresponding to the portion where the resistor region is formed, so that the required width of the base region may be maintained even if the emitter region is caused to dip due to formation of the resistor region.

(2) The emitter region is preliminarily so formed that it may have a decreased thickness and lower impurity concentration selectively at a portion corresponding to the portion where the resistor region is formed, whereby the portion caused to dip by forming the resistor region is cancelled or compensated for.

(3) After forming the base region, etching is effected so that the semiconductor substrate is protruded at a portion thereof corresponding to the portion where the resistor regions are to be formed. After this process diffusion is effected for shaping emitter regions. Thus the emitter region has a portion under the protruded portion which has less depth than the remaining portion of the emitter region which is formed simultaneously on the peripheral planar portion, so that a dipped portion produced during the formation of the resistor region is cancelled or compensated for.

In FIG. 4 there are shown characteristic curves for comparison between the electrical characteristics of the transistor in accordance with the present invention as illustrated in FIGS. 1 to 3 and the electrical characteristics of known transistors. These characteristic curves each show the way the current amplification factor $h_{FE}$ varies depending upon the value of the collector current $I_C$ when 5[V] of collector-to-emitter voltage is applied. The curve (a) indicates the characteristics of the transistor in accordance with the present invention and curve (b) indicates the characteristics of a known transistor shaped within a base region encircled by an annular ring emitter region at a step different from that for shaping the emitter region. Curve (c) indicates the characteristics of a known transistor with a resistor layer shaped within a base region encircled by an annular ring emitter region at the same step as the shaping of the emitter region. As will be noted from FIG. 4, the transistor of the present invention is not subject to a decrease in the current amplification factor even when used under the condition where a large collector current is applied. Thus, it will be appreciated that the transistor of the present invention is advantageous when used as a high power transistor.

FIGS. 5 through 7 show another embodiment of the present invention. In a transistor unit 21 of a transistor 20, as shown in FIGS. 5 through 7, an emitter region 22 is comprised of an active emitter region 22a disposed near the base contact region 16 and an inactive emitter region 22b shaped separately during another diffusion step than that for shaping the active emitter region 22a. The impurity concentration at the inactive emitter region 22b is lower than that at the active emitter region 22a, and the depth of the inactive emitter region 22b is less than that of the active emitter region 22a. The resistor region 7 is formed in the inactive emitter region 22b by a diffusion treatment. With this arrangement, not only are carrier injection from the resistor region 7 to the base region 4 and lowering of the current amplification factor completely prevented, but the resistor region 7 is substantially insulated from the active emitter region 22a. In FIGS. 5 through 7, the same parts and portions as illustrated in FIGS. 1 through 3 are denoted by the same numerals or letter as used in FIGS. 1 through 3. The transistor 20 is configured identically with the transistor 1, except that the emitter region formed in each of the transistor units is configured differently from that of the transistor unit 6 of the transistor 1.

Figure 8:
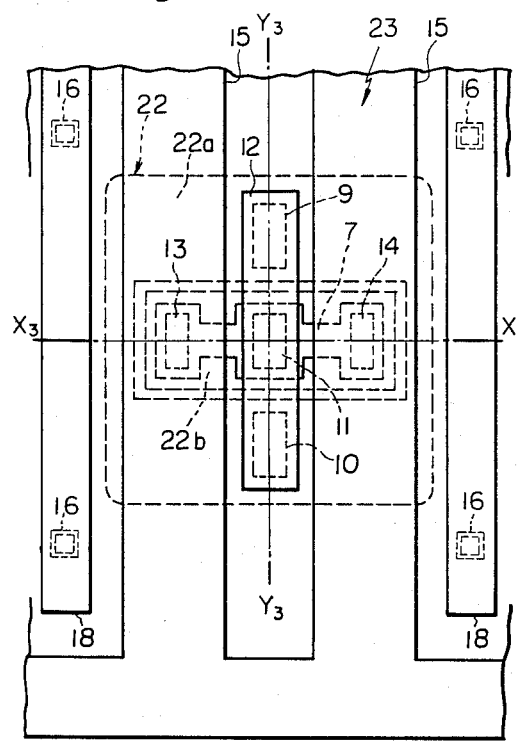
FIG. 8 is a plan view of a modified form of the transistor illustrated in FIG. 5.
Figure 10:
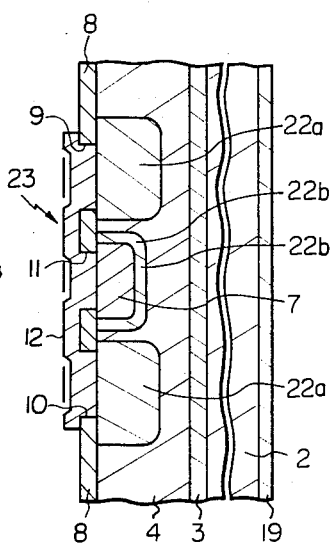
FIG. 10 is a cross-sectional view taken along a line $Y_3$—$Y_3$ of FIG. 8.
Figure 9:
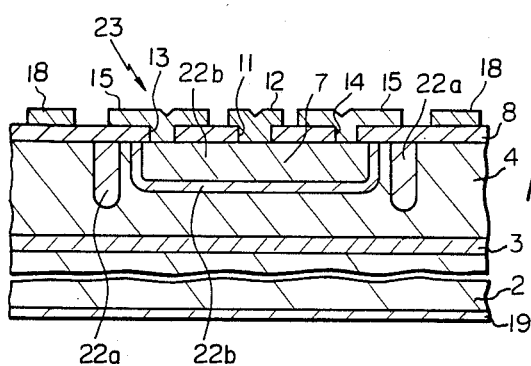
FIG. 9 is a cross-sectional view taken along a line $X_3$—$X_3$ of FIG. 8.

Although the active emitter region 22a and the inactive emitter region 22b are formed so as to be contiguous to each other in the transistor unit 21, a transistor unit may have, like a transistor unit 23 illustrated in FIGS. 8 to 10, the inactive emitter region 22b spaced from the active emitter region 22a and held in an electrically floating state.

In an effective mode for carrying out the present invention, as in a transistor unit 24 illustrated in FIGS. 11 to 13, an emitter region 25 has recessed portions 25a and 25b formed at a part of the periphery thereof to increase the peripheral length of the emitter region 25. As a result, the transistor characteristic of the invention at a high frequency range is very much improved over the transistor 1 illustrated in FIGS. 1 through 3. Protruded portions may be formed instead of the recessed portions 25a and 25b. When the recessed portion is formed at a part of the periphery of the emitter region 24, additional base contact regions 40 may be provided in the base region 4 at positions confronting the recessed portions, respectively, to further enhance the improvement in the high frequency characteristic resulting from the provision of the recessed portions.

Another effective embodiment of the present invention is illustrated in FIGS. 14 to 16. In this embodiment, a transistor 26 is formed in such a way that base contact regions 27 are shaped in the form of a strip encompassing the emitter regions 5. In accordance with this arrangement, the effective opposing area, within which the emitter region 5 confronts the base contact region 27, is so much increased and the base resistance rbb' is so reduced, that the high frequency characteristic of the transistor is remarkably improved. Numeral 28 designates a window for permitting the connection between the base contact region 27 and the base wiring electrode 18 therethrough.

Figure 17:
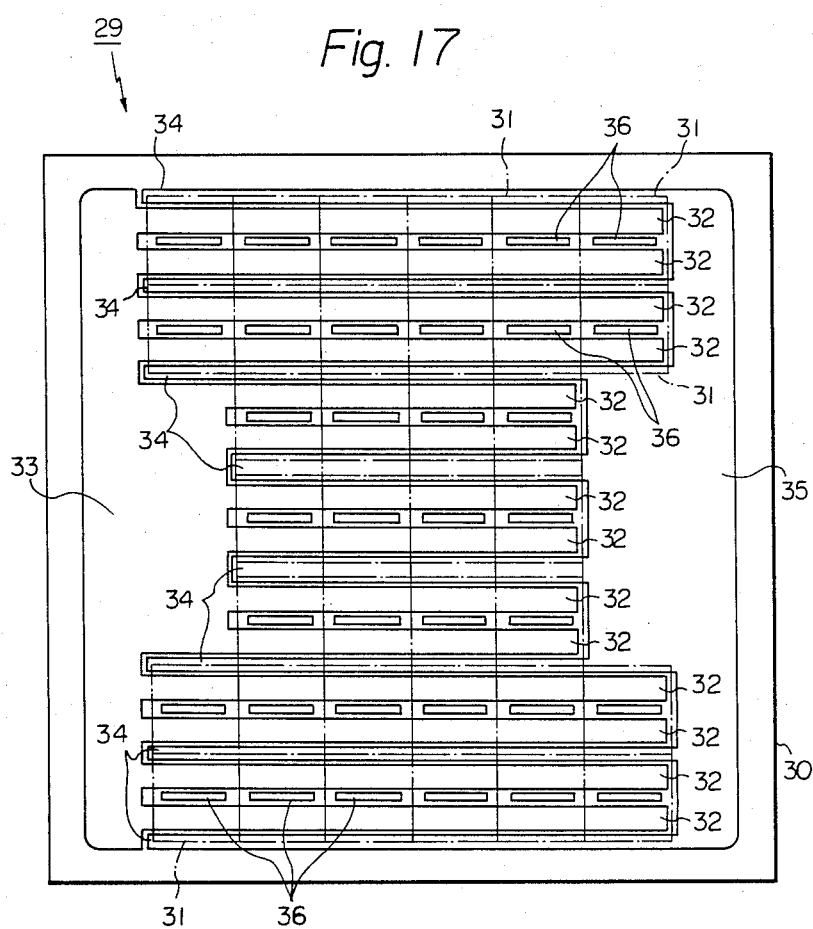
FIG. 17 is a plan view of an entire chip of the transistor in accordance with the present invention.

FIG. 17 is a plan view of an entire transistor 29, according to the present invention, which has 36 transistor units formed therein. The transistor 29 is provided on a single chip 30 and is comprised of 36 transistor units 31 designated by one dot-and-chain lines. In FIG. 17, 32 is an emitter wiring electrode, 33 an emitter electrode terminal, 34 a base wiring electrode, 35 a base electrode terminal, and 36 a metal layer connecting a resistor region to an emitter region corresponding thereto. In FIG. 17, the resistor regions are omitted.

Figure 18:
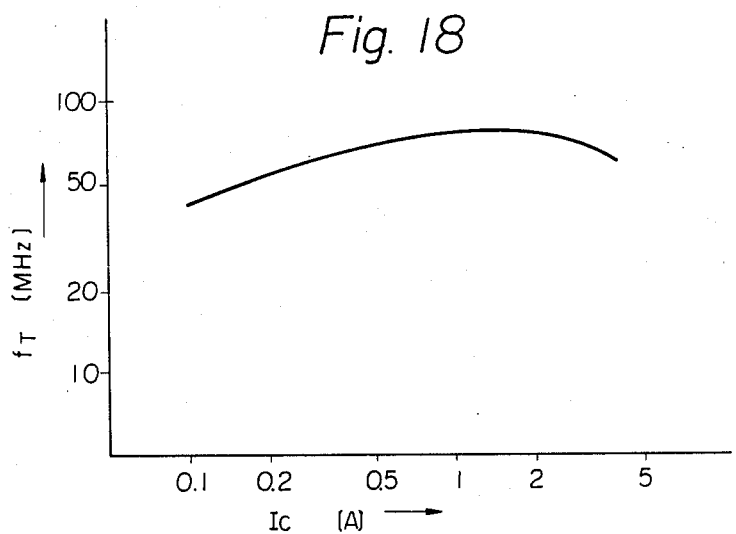
FIGS. 18 to 20 are characteristics diagrams, each indicating the characteristics of the transistor in accordance with the present invention.
Figure 19:
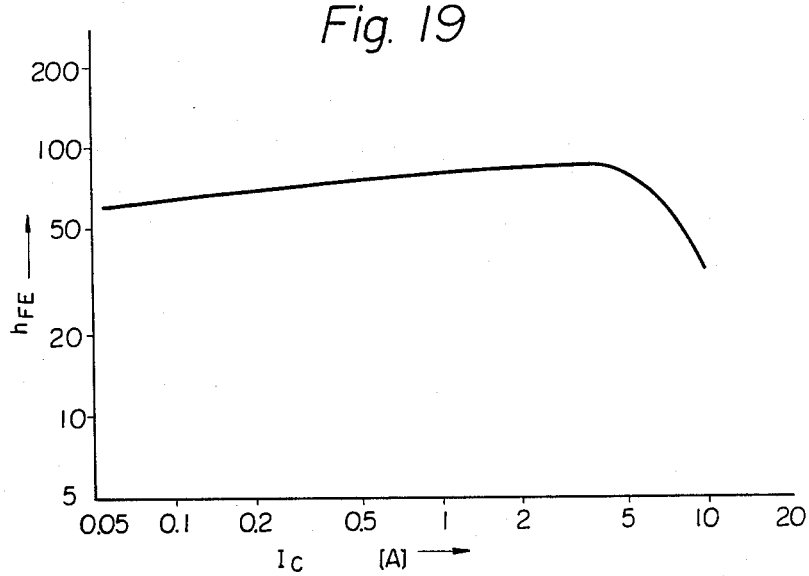
Figure 20:
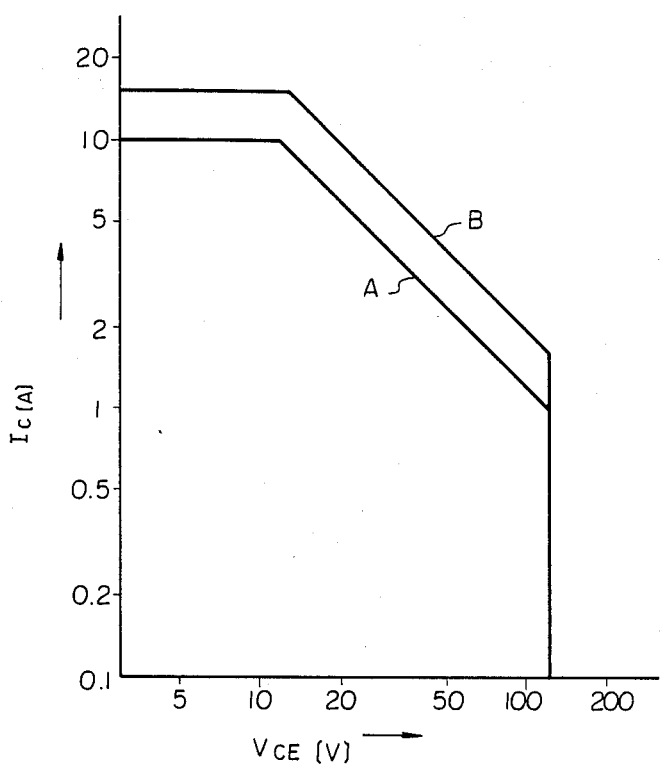

In the transistor 29 fabricated as mentioned above, when the respective transistor units thereof are arranged as illustrated in FIGS. 1 through 3 and the transistor is of NPN-type having values specified in the following list, the electrical characteristics thereof are as indicated in FIGS. 18 to 20.

| | |
|---|---|
| Resistivity of N$^+$-type semiconductor substrate | 0.012 [$\Omega$.cm] |
| Resistivity of N-type epitaxial layer | 16 [$\Omega$.cm] |
| Thickness of N-type epitaxial layer | 35 [$\mu$] |
| Surface impurity concentration at P-type base region | $1 \times 10^{18}$ [atom number/cm3] |
| Depth of P-type base region | 5 [$\mu$] |
| Surface impurity concentration at P$^+$-type base contact region | $2 \times 10^{20}$ atom number/cm$^3$ |
| Depth of P$^+$-type base contact region | 1.5 [$\mu$] |
| Length of one side of N$^+$-type emitter region | 360 [$\mu$] |

-continued

| | |
|---|---|
| Curvature radius of a corner of N+-type emitter region | 20 [μ] |
| Length of P+-type resistor region | 240 [μ] |
| Width of P+-type resistor region (maximum) | 80 [μ] |
| Width of P+-type resistor region (minimum) | 40 [μ] |
| Resistance value of resistor region (combined resistance of resistor between window 11 and 13 and resistor between 11 and 14) | 3.75 [Ω] |
| Thickness of insulation layer | 1 [μ] |
| Width of emitter wiring electrode (per piece) | 110 [μ] |
| Width of base wiring electrode | 50 [μ] |
| Width of metal layer | 50 [μ] |
| Thickness of each ow wiring electrodes and metal layer | 4 [μ] |

FIG. 18 is a graph showing the gain-bandwidth produce characteristic $f_T$ of the NPN-type transistor 29 according to the present invention, as illustrated in FIG. 17, with respect to a collector current $I_C$. This characteristic was measured under the following conditions of: $V_{CE}=10$ V (fixed); an input signal frequency 10[MHz], and; a temperature 25° C.

As seen from the result, the transistor of the present invention exhibits an excellent characteristic of $f_T=42$ to 80 MHz in the range of $I_C=0.1$ to 4A.

FIG. 19 is a graph indicating the current amplification factor characteristic $h_{FE}$ of the transistor 29 with respect to a collector current $I_C$.

This was measured with $V_{CE}+5$ V (fixed) at a temperature of 25° C.

As seen from FIG. 19, the transistor of the present invention exhibits an excellent characteristic of $h_{FE}=60$ to 84 in the range of $I_C=0.05$ to 7 A.

Further, FIG. 20 is a graph indicating the area of safe operation (abbreviated to "ASO" or "SOA") characteristic of the transistor in accordance with the present invention. This characteristic was measured at a temperature of 25° C. In the figure, A is the area of safe operation with respect to a DC current and B is the area of safe operation with respect to a single pulse having a width of 10 ms.

As seen from FIG. 20, the area of safe operation of the transistor in accordance with the present invention is large enough for direct current or pulse.

Although all of the foregoing embodiments have been illustrated and described in terms of NPN-type transistors, it should be obvious that the invention is also applicable to PNP-type transistors.

Furthermore, the plan configuration of the resistor region is not limited to the one illustrated in the drawings and it can be shaped in any configuration, so long as it can attain the desired resistance value.

According to the present invention, since the resistor, region acting as a stabilizing resistor is disposed in a region formed within the base region and having the opposite conductivity type to the base region, the resistor region is not in direct contact with the base region and the current amplification factor of the transistor is very much increased over that of conventional transistors. Further, by arranging the resistor regions as mentioned above, the connecting metal layers are disposed on the major face of the transistor in such a manner that they do not intersect each other, so that an insulation layer otherwise required for insulation between the metal layers, can be omitted. Therefore, this invention can provide a transistor which is capable of being fabricated in a reduced number of steps, but without causing the lowering of the yield, and yet shows excellent electrical characteristics.

We claim:

1. A transistor comprising:
   a collector region of a first conductivity type;
   a base region of a second conductivity type, opposite to the first conductivity type, formed in said collector region;
   a plurality of substantially rectangular shaped emitter regions of the first conductivity type formed separately in said base region and arranged substantially along a line which passes through the center of each of said emitter regions;
   stabilizing resistor regions of the second conductivity type respectively formed in said emitter regions;
   emitter wiring electrodes respectively connected to said stabilizing resistor regions at points spaced from the line which passes through the center of each of said emitter regions, said stabilizing resistor regions being arranged in a direction substantially orthogonal to the direction in which said emitter wiring electrodes are extended; and
   conductive means, extending in parallel with said emitter wiring electrodes and along the line which passes through the center of each of said emitter regions, for connecting said stabilizing resistor regions and said emitter regions, said conductive means contacting each of said emitter regions at two points which are on opposite sides of the corresponding stabilizing resistor region.

2. A transistor as set forth in claim 1, further comprising an insulation layer covering the surface of said transistor, wherein said emitter wiring electrodes comprise an electrode metal layer formed on the insulation layer.

3. A transistor as set forth in claim 2, further comprising:
   additional regions arranged in a matrix formation within said base region and having an impurity concentration higher than that of said base region; and
   at least one base wiring electrode formed on said insulation layer so as to linearly extend substantially in parallel with said emitter wiring electrodes, said at least one base wiring electrode being connected to said additional regions.

4. A transistor comprising:
   a semiconductor substrate;
   a collector region of a first conductivity type formed on said semiconductor substrate;
   a base region of a second conductivity type, opposite to the first conductivity type, formed contiguous to said collector region;
   a plurality of substantially rectangular shaped emitter regions of the first conductivity type formed within said base region, said plurality of emitter regions being arranged in one or more lines;
   resistor regions of the second conductivity type, respectively formed within said emitter regions, each of said resistor regions acting as a stabilizing resistor and having a longitudinal axis which crosses one of the one or more lines;

at least one pair of linear emitter wiring electrodes commonly connected to the respective ends of said resistor regions; and conductive means, formed adjacent to said at least one pair of linear emitter wiring electrodes and along the center of said emitter regions, for connecting the middle portions of said resistor regions to the corresponding emitter regions without contacting said at least one pair of emitter wiring electrodes.

5. A transistor as set forth in claim 4, further comprising an insulation layer formed on said base region, said emitter regions, and said resistor regions, wherein said at least one pair of linear emitter wiring electrodes and said conductive means are formed on said insulation layer.

6. A transistor as set forth in claim 4, further comprising:

an insulation layer formed on said base region, said emitter regions and said resistor regions; and at least one base wiring electrode formed on said insulation layer and connected to said base region, said at least one base wiring electrode being disposed so as to extend substantially in parallel with said at least one pair of linear emitter wiring electrodes.

7. A transistor as set forth in claim 4, wherein each of said emitter regions includes a peripheral portion and a central portion, wherein said peripheral portion extends further into said base region than said central portion, and wherein each of said resistor regions is formed at said central portion of the corresponding one of said emitter regions.

8. A transistor comprising:

a semiconductor substrate;

a collector region of a first conductivity type formed on said semiconductor substrate;

a base region of a second conductivity type, opposite to the first conductivity type, formed on said collector region;

a plurality of emitter regions of the first conductivity type formed in said base region, said emitter regions each having the shape of an annular ring and having an inactive portion formed within the annular ring, said emitter regions being arranged in one or more lines;

resistor regions of the second conductivity type formed in said inactive regions, respectively, to act as stabilizing resistors, said resistor regions having longitudinal axes which intersect the line or lines of said emitter regions;

at least one pair of linear emitter wiring electrodes commonly connected to the respective ends of said resistor regions; and conductive means, formed adjacent said at least one pair of linear emitter wiring electrodes and along the line or lines of said emitter regions without contacting said at least one pair of linear emitter wiring electrodes, for connecting the middle portions of said resistor regions to the corresponding ones of said emitter regions.

* * * * *